United States Patent
Li et al.

(10) Patent No.: US 8,797,106 B2
(45) Date of Patent: Aug. 5, 2014

(54) CIRCUITS, APPARATUSES, AND METHODS FOR OSCILLATORS

(75) Inventors: Ming H. Li, Boise, ID (US); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/432,916

(22) Filed: Mar. 28, 2012

(65) Prior Publication Data

US 2013/0257548 A1 Oct. 3, 2013

(51) Int. Cl.
*H03K 3/03* (2006.01)
*H03L 1/00* (2006.01)

(52) U.S. Cl.
USPC .............................. 331/57; 331/176; 331/185

(58) Field of Classification Search
USPC ......... 327/149, 158, 182, 269–271, 276–278, 327/284; 331/45, 57, 176, 185
See application file for complete search history.

(56) References Cited

U.S. PATENT DOCUMENTS

| | | | | |
|---|---|---|---|---|
| 4,853,654 A | * | 8/1989 | Sakurai | 331/57 |
| 4,891,609 A | * | 1/1990 | Eilley | 331/57 |
| 5,479,129 A | * | 12/1995 | Fernandez et al. | 327/276 |
| 5,661,428 A | | 8/1997 | Li et al. | |
| 5,808,506 A | | 9/1998 | Tran | |
| 5,864,258 A | * | 1/1999 | Cusinato et al. | 331/34 |
| 6,154,100 A | * | 11/2000 | Okamoto | 331/57 |
| 6,756,833 B2 | * | 6/2004 | Miura | 327/277 |
| 6,933,869 B1 | | 8/2005 | Starr et al. | |
| 6,995,621 B1 | * | 2/2006 | Culler | 331/57 |
| 7,009,457 B2 | * | 3/2006 | Kim | 331/57 |
| 7,554,413 B2 | * | 6/2009 | Kim | 331/16 |
| 7,589,583 B2 | * | 9/2009 | Yoshikawa et al. | 327/536 |
| 7,847,617 B2 | * | 12/2010 | Chen | 327/536 |
| 7,986,160 B2 | | 7/2011 | Hoang et al. | |
| 8,258,880 B2 | * | 9/2012 | Koh et al. | 331/34 |
| 8,350,628 B1 | * | 1/2013 | Bennett | 331/57 |
| 2009/0267698 A1 | * | 10/2009 | Lin | 331/57 |
| 2011/0080145 A1 | | 4/2011 | Tsukuda | |

* cited by examiner

*Primary Examiner* — Levi Gannon
(74) *Attorney, Agent, or Firm* — Dorsey & Whitney LLP (57) ABSTRACT

Circuits, apparatuses, and methods are disclosed for oscillators. In one such example oscillator circuit, a plurality of delay stages are coupled in series. A variable delay circuit stage is coupled to the plurality of delay stages and is configured to delay a signal through the variable delay circuit stage by a variable delay. The variable delay increases responsive to a rising magnitude of a supply voltage provided to the variable delay circuit stage.

22 Claims, 4 Drawing Sheets

CIRCUITS, APPARATUSES, AND METHODS FOR OSCILLATORS

TECHNICAL FIELD

Embodiments of the invention relate generally to integrated circuits, and more particularly, in one or more of the illustrated embodiments, to oscillators.

BACKGROUND OF THE INVENTION

Ring oscillators generally include an odd number of series coupled stages, and provide a periodic output signal. Generally, the frequency of the output signal depends, among other things, on the rate at which each of the stages charges and discharges its respective output node (which is the respective input node for the next stage in the series). For example, if each stage includes an inverter formed from an n-channel field effect transistor (nFET) and a p-channel field effect transistor (pFET), the frequency of the output signal generally depends on the rate at which each nFET discharges that stage's output node and the rate at which each pFET charges that output node. The rate at which the nFET and pFET respectively discharge and charge the output node in turn depends, among other things, on the magnitude of the supply voltage provided to the inverters and the operating temperature of the oscillator. Generally, the lower the operating temperature and the higher the magnitude of the supply voltage, the faster the nFETs and pFETs will respectively discharge and charge the output node due to the nFETs and pFETs being more conductive and less resistive when respectively discharging and charging the output node. The faster that the nFETs and pFETs respectively discharge and charge the output node, the shorter the delay through each stage, and consequently, the faster the frequency of the periodic signal generated by the ring oscillator.

Conventionally, the magnitude of the supply voltage for the stages in a ring oscillator is regulated in order to reduce variations in oscillation speed for different supply voltage magnitudes. For example, if the external supply voltage provided to the oscillator is known to vary between 1.28V and 1.575V, a supply voltage regulator may provide a regulated voltage of approximately 1.35V to the oscillator regardless of changes in the external voltage provided. However, merely regulating the supply voltage with a supply voltage regulator does not remedy variations in the charging and discharging times for each stage caused by temperature variations. Also, the regulators that regulate the supply voltage can occupy space on and consume power in an integrated circuit.

If the supply voltage regulator is removed, however, the variations in oscillation speed for different supply voltage magnitudes can be relatively large and unpredictable. For example, if a voltage regulator does not regulate the supply voltage provided to the stages, an increase in the magnitude of the supply voltage will generally increase the frequency of the output signal generated by the ring oscillator, as described above.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
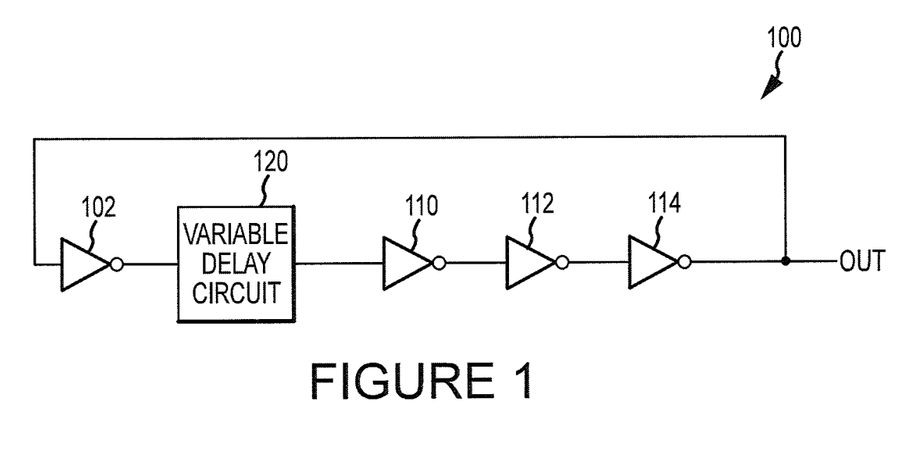
FIG. 1 is a block diagram of an oscillator according to an embodiment of the present invention.

FIG. 1 illustrates an oscillator circuit 100 with a plurality of delay stages 102, 120, 110, 112, 114 coupled in series, with the output of the last stage 114 coupled to the input of the stage 102. In operation, the oscillator circuit 100 provides a periodic output signal OUT at the output of the last stage 114. Because the number of delay stages 102, 120, 110, 112, 114 is odd, the oscillator circuit does not reach a steady state, but instead the output of each of the delay stages 102, 120, 110, 112, 114 continuously transitions between logic high and logic low voltage levels, which in turn causes the output of the last stage 114 to provide the OUT signal.

One of the delay stages is a variable delay circuit stage 120 that is configured to delay a signal that propagates through the variable delay circuit stage 120 by a variable delay. The variable delay increases responsive to a rising magnitude of a supply voltage provided to the variable delay circuit stage 120, and may not substantially change responsive to a changing operating temperature of the variable delay circuit stage 120. In other words, the variable delay is proportional to the magnitude of the supply voltage provided to the variable delay circuit stage 120 and may not be proportional to the operating temperature of the variable delay circuit stage 120. As explained in more detail below, the variable delay through the variable delay circuit stage 120 changes (e.g., increases) as the charging and/or discharging time of a node within the variable delay circuit stage 120 changes (e.g., increases) responsive to a changing (e.g., increasing) magnitude of the supply voltage provided to the variable delay circuit stage 120.

The other delay stages 102, 110, 112, 114 may also delay a signal that propagates through each respective stage. However, the delay introduced by each of the other delay stages 102, 110, 112, 114 may be shorter relative to the variable delay through the variable delay circuit stage 120. Because of this, the frequency of the OUT signal provided by the oscillator circuit 100 may change primarily responsive to the variable delay through the variable delay circuit stage 120. The frequency of the OUT signal changes responsive to the variable delay through the variable delay circuit stage 120 in that the frequency of the OUT signal is inversely proportional to the variable delay, which, in turn, is proportional to the delay incurred in charging or discharging the node within the variable delay circuit stage 120.

Figure 2:
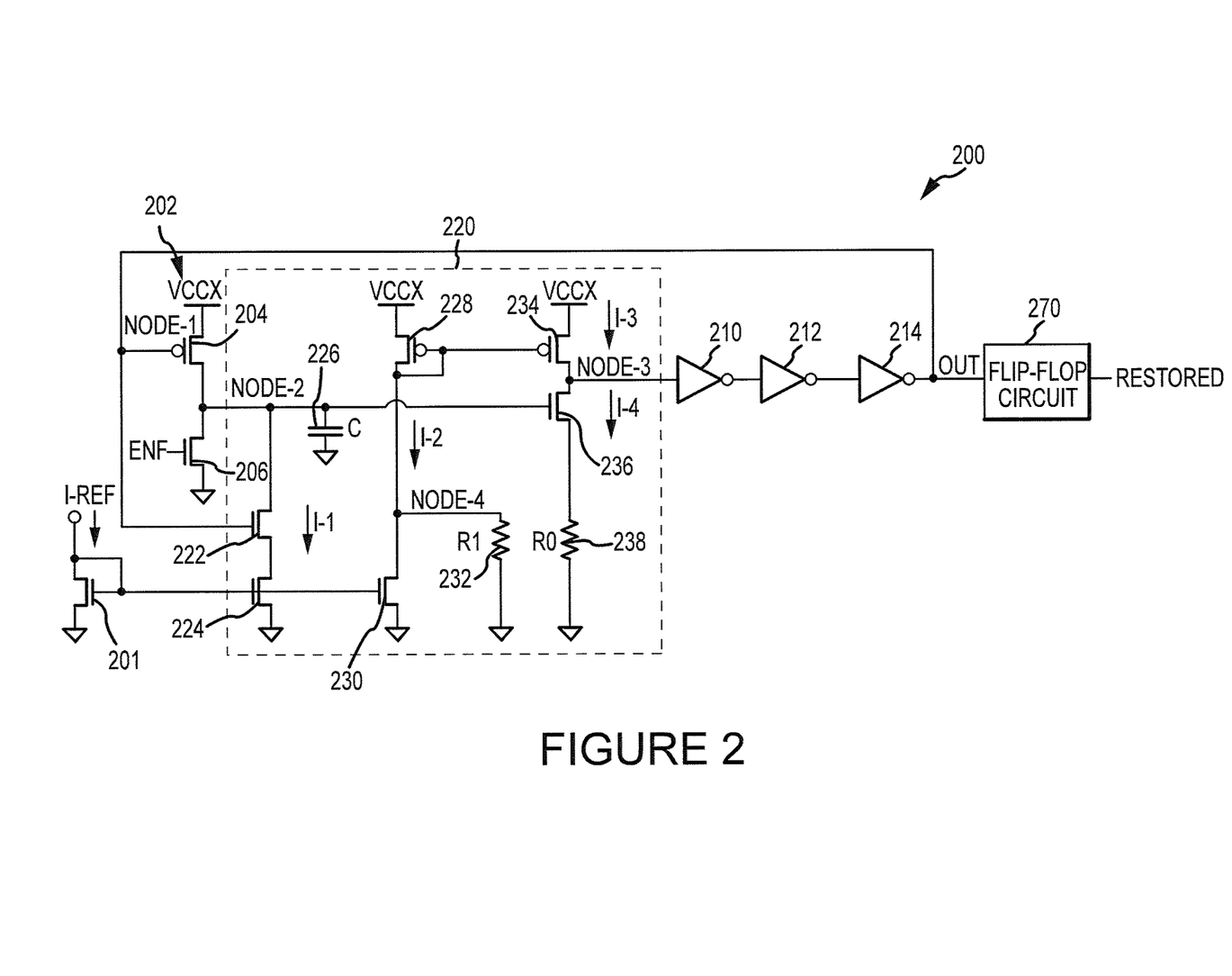
FIG. 2 is a schematic diagram of an oscillator according to an embodiment of the invention.

FIG. 2 illustrates a schematic diagram of one embodiment of an oscillator circuit 200 that may be used for the oscillator circuit 100 in FIG. 1. Similar to the oscillator circuit 100 in FIG. 1, the oscillator circuit 200 in FIG. 2 includes a plurality of delay stages 202, 220, 210, 212, 214 coupled in series, with the output of the last stage 214 coupled to the input NODE-1 of the stage 202. The output of the last stage 214 provides an output signal OUT, which may in some embodiments be provided to a flip-flop circuit 270 to provide a RESTORED signal, as described in more detail below.

The oscillator circuit 200 in FIG. 2 includes a variable delay circuit stage 220 that is configured to delay a signal that propagates through the variable delay circuit stage 120 by a variable delay. The variable delay may be proportional to the magnitude of the supply voltage VCCX provided to the variable delay circuit stage 220. The other delay stages 202, 210, 212, 214 each delay a signal that propagates through the oscillator circuit 200, but the delay introduced by each of the other delay stages 202, 210, 212, 214 may be shorter relative to the variable delay through the variable delay circuit stage 220. The delay may be shorter because, for example, the other delay stages 202, 210, 212, 214 have been designed to provide a relatively shorter delay. If the other delay stages 202, 210, 212, 214 are formed from nFETs and pFETs, for example, the delay may be shorter because these delay stages have relatively large drive strengths (compared to other delay stages in the integrated circuit incorporating the oscillator circuit 200). Similar to the oscillator circuit 100 in FIG. 1, the relatively shorter delays introduced by the other delay stages 202, 210, 212, 214 may allow the frequency of the oscillator circuit 200 in FIG. 2 to primarily change responsive to the variable delay through the variable delay circuit stage 220.

The delay stage 202 includes a pFET 204 coupled between a supply voltage VCCX node and NODE-2, and an nFET 206 coupled between NODE-2 and a reference voltage node, such as ground. The gate of the pFET 204 is coupled to NODE-1, which is in turn coupled to the output of the last delay stage 214. An ENF signal is provided to the gate of the nFET 206, which may be an enable signal that is provided as an active low signal (e.g., a logic low signal indicates that the oscillation circuit 200 should be enabled and a logic high signal indicates that the oscillation circuit 200 should be disabled). In some embodiments, the pFET 204 may be relatively wide and have relatively large drive strength. As will be described in more detail below, if the pFET 204 is relatively wide and has a relatively large drive strength, the time that it takes the stage 202 to charge NODE-2 may be relatively short in order to allow the delay through the stage 220 to change primarily responsive to the time that it takes the stage 220 to discharge NODE-2.

The variable delay circuit stage 220 (which is the second delay stage in the embodiment of FIG. 2) includes two nFETs 222, 224 coupled in series between NODE-2 and a reference voltage node, such as ground. The gate of one nFET 222 is coupled to NODE-1, and the gate of the other nFET 224 is coupled to another nFET 201 gate.

The variable delay circuit stage 220 also includes a capacitance 226 coupled between NODE-2 and a reference voltage node, such as ground. In some embodiments, the capacitance 226 may be a parasitic capacitance, whereas in other embodiments the capacitance 226 may be a discrete capacitance formed by, for example, an oxide layer of a FET or a capacitor. The variable delay circuit stage 220 also includes a pFET 234, an nFET 236, and a resistance 238 (with resistance value of R0) coupled in series between the supply voltage VCCX node and a reference voltage node, such as ground. The gate of the nFET 236 is coupled to NODE-2, and the gate of the pFET 234 is coupled to another pFET 228, as described in more detail below. The node between the drain of the pFET 234 and the drain of the nFET 236 is NODE-3 as illustrated in FIG. 2, and NODE-3 is coupled to the input of the delay stage 210 (which in turn is coupled to the delay stages 212, 214).

The nFET 201 and the nFET 224 together form a current mirror whereby the current I-1 through the nFETs 222 and 224 "mirrors" the current I-REF through the nFET 201. In some embodiments, the nFETs 201, 224 may be similarly scaled causing the currents I-1 and I-REF to be similar. In other embodiments, the nFETs 201, 224 may be scaled differently from one another, which may cause the currents I-1 and I-REF to be proportional to one another. The I-REF current is a reference current that may be proportional to the operating temperature of an integrated circuit incorporating the oscillator circuit 200 but may not depend on the magnitude of the supply voltage VCCX (e.g., the I-REF current may be temperature-dependent but supply-voltage-independent). The magnitude of the I-REF current may increase with increasing operating temperatures in some embodiments. In some embodiments, the I-REF current may be provided by, for example, a temperature sensor block (not illustrated in FIG. 2).

As illustrated in FIG. 2, the gates of the nFETs 201, 224 are coupled to the gate of another nFET 230, which may similarly "mirror" the I-REF current through nFET 201. The source of the nFET 230 is coupled to NODE-4. A resistance 232 (with resistance value of R1) is coupled between NODE-4 and a reference voltage node, such as ground. Also, a pFET 228 is coupled between NODE-4 and the supply voltage VCCX node. As mentioned above, the gate of the pFET 228 is coupled to the gate of the pFET 234, with the pFETs 228, 234 also forming a current mirror whereby the current I-3 through the pFET 234 mirrors the current I-2 through pFET 228, with the current I-3 being similar or proportional to the current I-2 depending on the scaling of the pFETs 228, 234.

The input of the delay stage 210 is coupled to NODE-3, and the delay stages 212, 214 are each, in turn, coupled to the output of delay stage 210. The delay stages 210, 212, 214 may help restore the signal provided by the delay stage 220 to complementary "clean" logic high and logic low levels because the signal provided by the delay stage 220 may not fully transition between a "clean" logic high to a "clean" logic low. The delay stage 214 provides the OUT signal. A flip-flop circuit 270 may be coupled to the output of the delay stage 214, and may help restore the duty cycle of the OUT signal so that the duty cycle of the RESTORED signal is approximately fifty percent. The flip-flop circuit 270 may also be used as a frequency divider in some embodiments, and the frequency division may be selectable in some embodiments (e.g., through a multiplexer). The RESTORED signal may, for example drive one or more pump core(s) in a charge pump in an integrated circuit, as described in more detail below.

In operation, the oscillator circuit 200 mirrors the supply-voltage-independent (but possibly temperature-dependent) I-REF current in discharging NODE-2 (including any charge stored on the capacitance 226), which, because it is charged through pFET 204 when conductive (e.g., NODE-1 is charged to a logic high), will have a charged voltage level that is proportional to the magnitude of the supply voltage VCCX. In other words because the nFETs 222, 224 discharge NODE-2 at a rate that is independent of the magnitude of the supply voltage, the amount of time required to discharge NODE-2 is proportional to the amount of charge stored on NODE-2 (including the charge stored on the capacitance 226), which is proportional to the magnitude of the supply voltage VCCX. Generally, the greater the magnitude of the supply voltage VCCX, the more charge will be stored on NODE-2 when it is charged, and so the longer it will take to discharge NODE-2 given a reference current that does not change with changing magnitudes of the supply voltage VCCX.

Because it will take longer to discharge NODE-2 for greater magnitudes of supply voltage VCCX, the delay through the variable delay circuit stage 220 will be longer for greater magnitude supply voltages VCCX, which in turn will decrease the frequency of the OUT signal and/or the RESTORED signal provided by the oscillator circuit 200. Conversely, because it will take less time to discharge NODE-2 for supply voltages VCCX with a lower magnitude, the delay through the variable delay circuit stage 220 will be shorter for supply voltages VCCX with lower magnitudes, which in turn will increase the frequency of the OUT signal and/or the RESTORED signal provided by the oscillator circuit 200. As the variable delay increases or decreases, the frequency of the OUT signal and/or the RESTORED signal will decrease or increase, respectively, because the frequency is inversely proportional to the variable delay.

When NODE-1 is discharged (e.g., to logic low), the nFET 222 may transition from being conductive to being non-conductive, and the pFET 204 may transition from being non-conductive to being conductive. When the pFET 204 becomes conductive, it charges NODE-2 including the capacitance 226 coupled to NODE-2. The pFET 204 may charge NODE-2 relatively quickly if the pFET 204 is relatively wide, as described above. The voltage level to which the pFET 204 charges NODE-2 is proportional to the magnitude of the supply voltage VCCX. In general, the greater the magnitude of the supply voltage VCCX, the higher the voltage to which NODE-2 will be charged. When NODE-2 is charged, the nFET 236 is conductive, which discharges NODE-3.

When NODE-1 is charged (e.g., to logic high), the pFET 204 may transition from being conductive to being non-conductive, and the nFET 222 may transition from being non-conductive to being conductive. When the nFET 222 becomes conductive, it discharges NODE-2 including the capacitance 226 coupled to NODE-2. The rate at which the nFET 222 discharges NODE-2 is constant for a given I-REF current. However, because the voltage level to which NODE-2 was charged is proportional to the magnitude of the supply voltage VCCX, the time or delay required to discharge the voltage level on NODE-2 (including the capacitance 226) is proportional to the magnitude of the supply voltage VCCX. Once NODE-2 is discharged to less than the threshold voltage, the nFET 236 becomes non-conductive, and the current I-3 will charge NODE-3.

In addition, if the I-REF current is proportional to the operating temperature of the operating circuit, the delay through the variable delay circuit stage 220 may be relatively stable across different operating temperatures because the I-REF current may compensate for lower threshold voltages of the FETs 222, 234, 236 (e.g., when operating temperature increases) by increasing the I-1, I-3, and I-4 currents, and may compensate for higher threshold voltages of the FETs 222, 234, 236 (e.g., when operating temperature decreases) by decreasing the I-1, I-3, and I-4 currents.

The time T it takes to discharge NODE-2 may in some embodiments be approximately calculated by the following equation if the widths of the transistors 234, 228, 230, 224 are similar and the threshold voltages (Vt) for the FETs 236, 228 are similar:

$$T_{DISCHARGE\_NODE-2} = C * \left[ \frac{(VCCX - Vt) * \left(1 - \frac{R0}{R1}\right)}{IREF} - R0 \right] \quad \text{(Equation 1)}$$

With reference to Equation 1, if temperature remains constant (with I-REF, R0, R1, and Vt thereby remaining constant), the time it takes to discharge NODE-2 generally increases with increasing magnitudes of the supply voltage VCCX. On the other hand, if the supply voltage VCCX remains relatively constant but temperature increases, I-REF, R0, R1 will increase while Vt decreases. If the resistance values R0, R1 have been properly chosen and the FETs 236, 228 have been properly designed, a nearly constant discharge delay may be achieved because the increases/decreases in I-REF, R0, R1, may effectively cancel out the decrease/increase in Vt.

Figure 3:
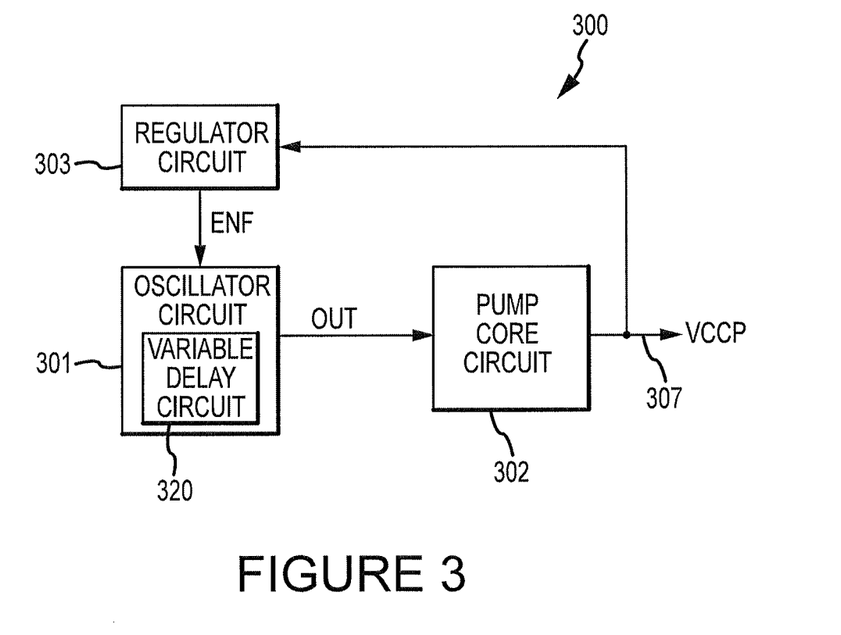
FIG. 3 is a block diagram of a charge pump according to an embodiment of the invention.

FIG. 3 illustrates a charge pump 300 that includes an oscillator circuit 301 that may be similar to the oscillator circuits 100, 200 described above. The oscillator circuit 301 provides a periodic signal OUT to a pump core circuit 302, which in turn provides a pumped voltage VCCP to a VCCP bus 307. The pumped voltage VCCP is also provided to a regulator circuit 303. The regulator circuit 303 may detect the voltage level of the pumped voltage VCCP on the VCCP bus 307 and selectively enable and disable the oscillator circuit 301 in response to the detected voltage level. For example, if the regulator circuit 303 detects that the voltage level of the voltage on the VCCP bus 307 is not adequate, the regulator circuit 303 may provide a logic low ENF signal to the oscillator circuit 301 in order to enable the oscillator circuit 301 and cause the oscillator circuit 301 to pump the pump core circuit 302. When the regulator circuit 303 detects that the voltage level on the VCCP bus 307 is adequate, the regulator circuit 303 may provide a logic high ENF signal to the oscillator circuit 301 in order to disable the oscillator circuit 301 and cause the oscillator circuit 301 to stop pumping the pump core circuit 302. In general, there may be a response delay between the time when the voltage level on the VCCP bus 307 is adequate and when the oscillator circuit 301 turns off responsive to the ENF signal being provided as logic high.

The amount of current that the charge pump 300 can provide to the VCCP bus 307 depends, among other things, on the magnitude of the supply voltage provided to the pump core circuit 302 and the frequency of the OUT signal (which in turn depends, among other things, on the magnitude of the supply voltage provided to the oscillator circuit 301). In general, the higher the magnitude of the supply voltage provided to the pump core and the faster the frequency of the OUT signal, the greater the amount of current (which may also be referred to as "capacity") that the charge pump 300 can provide to the VCCP bus 307.

As described above, in conventional charge pumps, the magnitude of the supply voltage provided to both the pump core circuit and the oscillator circuit is regulated. However, if the magnitude of the supply voltage provided to both the pump core circuit and the oscillator circuit is not regulated, then increasing magnitudes of supply voltage provided to either or both of the oscillator circuit and the pump core circuit may increase the amount of current that the charge pump can provide to the VCCP bus. While it may be desirable in some instances to have an increased amount of current available, in other instances, it may not be desirable to have an increased amount of current available due to, for example, a constant current demand across different magnitudes of the supply voltage. For example, as described above, there may be a response delay between the time when the voltage level of the pumped voltage VCCP is adequate and when the oscillator circuit turns off in response to the ENF signal provided by the regulator circuit. If there is a relatively large amount of current available from the pump core circuit (due to an increased magnitude of supply voltage provided to the oscillator circuit and/or to the pump core circuit), the current provided by the pump core circuit will continue to charge the VCCP bus during the response delay described above, which may overcharge the VCCP bus, creating noise on the VCCP bus. Additionally, the faster the frequency of the oscillator circuit 301, the lower the efficiency of the charge pump may be. So, for unregulated conventional charge pumps, the increased magnitude of the supply voltage provided to both the oscillator circuit and the pump core circuit may increase the noise on the VCCP bus while at the same time decrease the efficiency of the charge pump, both of which may waste power. Additionally, the increased current may require relatively wide interconnect wires to be used within the charge pump (particularly in the pump core circuit) in order to prevent electrical migration degradation.

Accordingly, the oscillator circuit 301 illustrated in FIG. 3 includes a variable delay circuit 320 such as one of the variable delay circuits 120, 220 described above. The variable delay circuit 320 allows the oscillator circuit 301 to provide the OUT signal at a frequency that decreases for increasing magnitudes of supply voltage VCCX. The decreased frequency of the OUT signal provided to the pump core circuit 302 may reduce the capacity of the charge pump 300. The decreased capacity of the charge pump 300 due to the decreased frequency of the OUT signal may, however, be counteracted by the increased capacity due to the increased magnitude of supply voltage provided to the pump core circuit 302. The charge pump 300 may be useful in applications where the demand for current from the charge pump 300 is relatively constant, a few examples of which are given below.

Furthermore, because the variable delay circuit 320 reduces the capacity of the charge pump 300, noise may be reduced on the VCCP bus 307 and the efficiency of the charge pump 300 may increase. Also, because the variable delay circuit 320 prevents the capacity from greatly increasing when the magnitude of the supply voltage VCCX increases, the thickness of interconnect wires within the pump core circuit 302 and the charge pump 300 in general may be reduced. The reduced thickness of interconnect wires in turn may allow for a charge pump 300 that occupies a smaller area on an integrated circuit, and may simplify routing of the interconnect wires within the pump core circuit.

Figure 4:
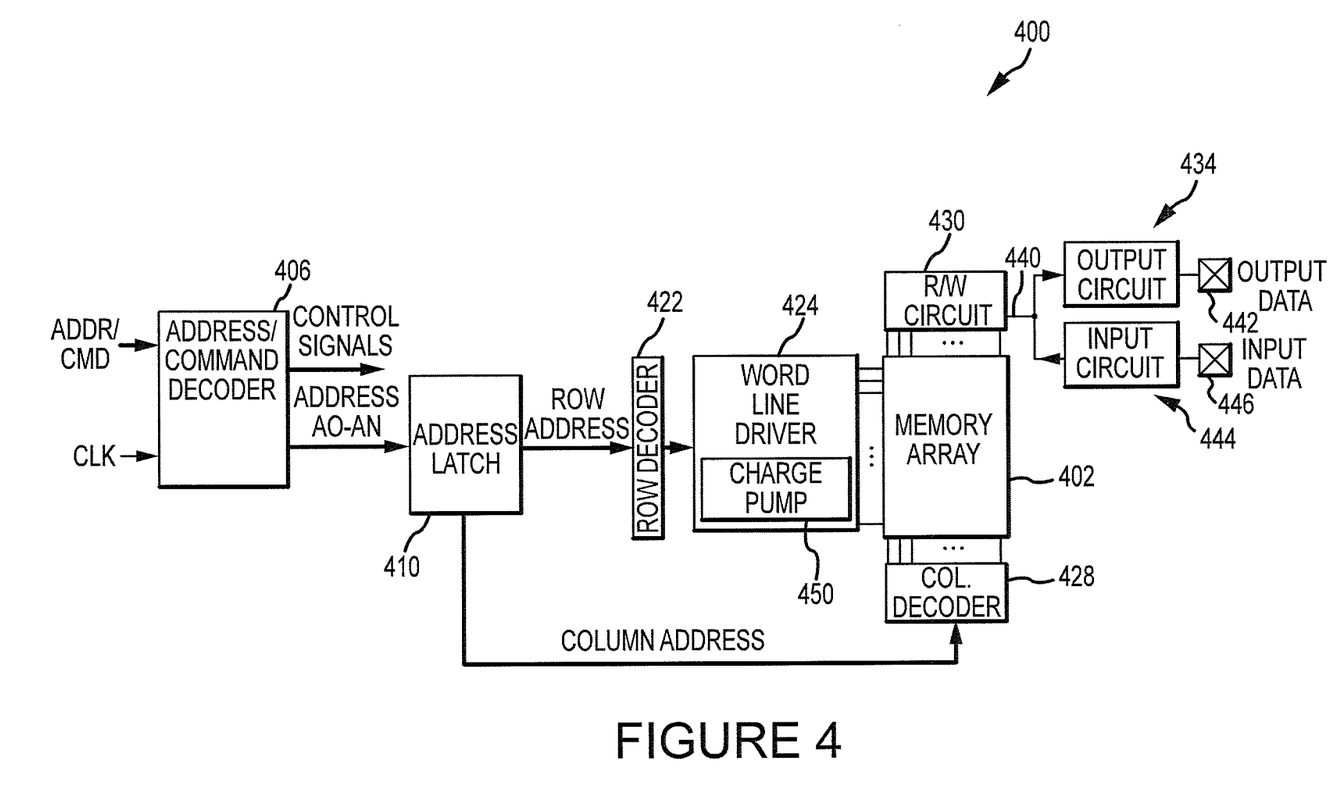
FIG. 4 is a block diagram of a memory according to an embodiment of the invention.

FIG. 4 illustrates a portion of a memory 400 according to an embodiment of the present invention. The memory 400 includes an array 402 of memory cells, which may be, for example, DRAM memory cells, SRAM memory cells, flash memory cells, or some other types of memory cells. The memory 400 includes an address/command decoder 406 that receives memory commands and addresses through an ADDR/CMD bus. The address/command decoder 406 provides control signals, based on the commands received through the ADDR/CMD bus. The address/command decoder 406 also provides row and column addresses to the memory 400 through an address bus and an address latch 410. The address latch then outputs separate column addresses and separate row addresses.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output circuit 434 via an input-output data bus 440. An output pad 442 coupled to the data output circuit 434 is used for electrically coupling to the memory 400. Write data are provided to the memory array 402 through a data input circuit 444 and the memory array read/write circuitry 430. An input pad 446 coupled to the data input circuit 442 is used for electrically coupling to the memory 400. The address/command decoder 406 responds to memory commands and addresses provided to the ADDR/CMD bus to perform various operations on the memory array 402. In particular, the address/command decoder 406 is used to provide control signals to read data from and write data to the memory array 402.

The word line driver 424 may include one or more charge pumps 450, which may include an oscillator circuit such as those 100, 200, 301 described above. The charge pump 450 may provide a pumped voltage VCCP to one or more word lines during programming of the word lines, and the charge pump(s) may be similar to the charge pump 300 illustrated in FIG. 3 and described above.

Alternatively, or in addition to the charge pump 450 including an oscillator circuit as described herein, the memory 400 may include an oscillator circuit in a self-refresh circuit (not specifically illustrated in FIG. 4). The self-refresh circuit may refresh the data stored in the cells of the memory array 402. The rate at which the data in the memory array 402 needs to be refreshed may be inversely proportional to the magnitude of the supply voltage provided to the memory array. If the magnitude of the supply voltage provided to the memory array is relatively low, then the cells of the memory array 402 may need to be refreshed more often, whereas if the magnitude of the supply voltage provided to the memory array is relatively high, then the cells of the memory array 402 may need to be refreshed less often. As such, an oscillator with an output signal that whose frequency is inversely proportional to the magnitude of the supply voltage provided to the memory array 402 may be used to control the refresh rate of the memory array 402 in order to reduce power that may be wasted if the memory array 402 is needlessly refreshed too often when the magnitude of the supply voltage is relatively high, while still refreshing the memory array 402 frequently enough when the magnitude of the supply voltage is relatively low. In these cases, the supply voltage for the memory array 402 may be used as the supply voltage for the oscillator.

From the foregoing it will be appreciated that, although specific embodiments of the invention have been described herein for purposes of illustration, various modifications may be made without deviating from the spirit and scope of the invention. For example, FIGS. 1, 2, and 3 illustrate embodiments of an oscillator circuit 100, 200, 301, FIGS. 1, 2, and 3 illustrate embodiments of a variable delay circuit 120, 220, 320, and FIGS. 3 and 4 illustrated embodiments of a charge pump 300, 450. However, other oscillator circuits, variable delay circuits and/or other charge pumps may be used, which are not limited to having the same design, and may be of different designs and include circuitry different from the circuitry in the embodiments illustrated in these Figures.

For example, the oscillator circuits 100, 200 illustrated in FIGS. 1 and 2 may be used in applications other than a charge pump. As another example, although FIG. 2 illustrates an oscillator circuit 200 wherein the variable delay through the variable delay circuit 220 is proportional to the amount of time required to discharge NODE-2, another embodiment of an oscillator circuit 200 may include a variable delay circuit wherein the variable delay is proportional to the time required to charge a node. Also, although the oscillator circuit 200 includes a variable delay circuit stage 220 as the second delay stage, a variable delay circuit stage may be included as the third stage, or as a different stage. In still other embodiments, a plurality of variable delay circuit stages may be included in an oscillator circuit.

Furthermore, the oscillator circuits illustrated and described herein may be used in a broad range of different apparatuses, such as circuitry, a memory device, a memory system (e.g., SSD), an electronic device or system (e.g., a computer, smart phone, server, etc.), and so forth.

Accordingly, the invention is not limited except as by the appended claims.

What is claimed is:

1. An oscillator circuit, comprising:
a plurality of non-adjustable delay stages coupled in series; and
a variable delay circuit stage coupled to the plurality of non-adjustable delay stages and configured to delay a signal through the variable delay circuit stage by a variable delay, the variable delay increasing responsive to a rising magnitude of a supply voltage provided to the variable delay circuit stage and the variable delay is proportional to an amount of time required to discharge a node in the variable delay circuit stage, wherein the node is discharged by a current source that is substantially independent of the magnitude of the supply voltage provided to the variable delay circuit stage.

2. The oscillator circuit of claim 1, wherein the variable delay does not substantially change responsive to a changing operating temperature of the variable delay circuit stage.

3. The oscillator circuit of claim 1, further comprising a flip-flop circuit coupled to one of the plurality of non-adjustable delay stages and configured to restore a duty cycle of the signal.

4. The oscillator circuit of claim 1, wherein the variable delay is proportional to an amount of time required to charge a node in the variable delay circuit stage.

5. The oscillator circuit of claim 1, further comprising a current mirror configured to provide the current source by mirroring a reference current from a temperature sensor block.

6. An apparatus, comprising:
an oscillator circuit comprising:
a first stage configured to charge a node and incur a delay to charge the node that is substantially independent of a magnitude of a supply voltage, the node coupled to a capacitance; and
a variable delay stage configured to discharge the node, the delay incurred in discharging the node being proportional to the magnitude of the supply voltage provided to the variable delay stage.

7. The apparatus of claim 6, wherein the delay incurred in discharging the node is a first delay and the first delay is substantially shorter than a second delay incurred in charging the node and the capacitance.

8. The apparatus of claim 6, wherein the oscillator circuit further comprises a plurality of additional delay stages coupled to an output of the variable delay stage and configured to drive a signal propagated through the plurality of additional stages to complementary logic levels.

9. The apparatus of claim 6, further comprising a pump core circuit configured to receive a periodic signal provided by the oscillator circuit and in response provide a pumped voltage to a bus, the periodic signal having a frequency that is inversely proportional to the delay incurred in discharging the node.

10. The apparatus of claim 9, further comprising a regulator circuit configured to selectively enable or disable the oscillator circuit in response to the pumped voltage being respectively inadequate or adequate.

11. The apparatus of claim 9, further comprising a word line driver coupled to the bus and configured to drive a word line in a DRAM memory with the pumped voltage.

12. A method, comprising:
generating a periodic oscillation signal in an oscillator circuit including a plurality of delay stages;
varying the frequency of the periodic oscillation signal by varying a delay of the periodic signal through a variable delay circuit stage of the oscillator circuit, the delay increasing responsive to an increasing magnitude of a supply voltage provided to the variable delay circuit stage and the delay of the variable delay circuit stage different than a delay stage of the plurality of delay stages; and
increasing the delay by charging a capacitance of the variable delay circuit stage to a voltage level that is proportional to a magnitude of the supply voltage provided to the variable delay circuit stage and discharging the capacitance throe current source that is substantially constant responsive to changes in the magnitude of the supply voltage.

13. The method of claim 12, further comprising not varying the delay responsive to a changing operating temperature of the variable delay circuit stage.

14. The method of claim 12, further comprising changing the current of the current source responsive to a changing operating temperature of the variable delay circuit stage.

15. The method of claim 14, wherein the current increases responsive to increases in the operating temperature of the variable delay circuit stage.

16. A method, comprising:
charging a node of a variable delay circuit stage to a voltage level that is proportional to a magnitude of a supply voltage;
mirroring a supply-voltage-independent reference current to discharge the node, with the amount of time incurred in discharging the node being proportional to the voltage level on the node and wherein the amount of time incurred in charging of the node is substantially independent of the supply-voltage-independent reference current; and
providing a periodic signal responsive to the amount of time incurred in discharging the node.

17. The method of claim 16, further comprising increasing the supply-voltage-independent reference current in response to an increased operating temperature.

18. The method of claim 17, further comprising compensating a lower threshold voltage of a field-effect transistor by mirroring the increased supply-voltage-independent reference current through the field-effect transistor.

19. A method, comprising:
charging a node of a variable delay circuit stage, with a charging delay incurred in charging the node substantially independent of a magnitude of a supply voltage provided to the variable delay stage;
discharging the node of the variable delay circuit stage, with a discharging delay incurred in discharging the node proportional to the magnitude of the supply voltage provided to the variable delay stage; and
providing a periodic signal having a frequency that is inversely proportional to the discharging delay incurred in discharging the node.

20. The method of claim 19, further comprising pumping a pump core circuit with the periodic signal.

21. The method of claim 20, further comprising driving a word line in a DRAM memory with a pumped voltage provided by the pump core circuit.

22. The method of claim 20, wherein the supply voltage provided to the variable delay stage is a first supply voltage, and wherein a second supply voltage that is substantially similar to the first supply voltage is provided to the pump core circuit.

* * * * *

UNITED STATES PATENT AND TRADEMARK OFFICE
CERTIFICATE OF CORRECTION

PATENT NO. : 8,797,106 B2
APPLICATION NO. : 13/432916
DATED : August 5, 2014
INVENTOR(S) : Ming H. Li et al.

Page 1 of 1

It is certified that error appears in the above-identified patent and that said Letters Patent is hereby corrected as shown below:

In the Claims

In column 10, line 19, in Claim 12, delete "throe" and insert -- through a --, therefor.

Signed and Sealed this
Twenty-eighth Day of October, 2014

Michelle K. Lee
*Deputy Director of the United States Patent and Trademark Office*